(12) United States Patent
Sun et al.

(10) Patent No.: US 6,664,853 B1
(45) Date of Patent: Dec. 16, 2003

(54) WIDE-BANDWIDTH DIFFERENTIAL SIGNAL AMPLIFIER

(75) Inventors: Runhua Sun, Tustin, CA (US); Thomas Clark Bryan, Rancho Santa Fe, CA (US); Zhixiang Jason Liu, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/061,735

(22) Filed: Jan. 31, 2002

(51) Int. Cl.[7] .................................................. H03F 3/45
(52) U.S. Cl. ........................................ 330/253; 330/252
(58) Field of Search ................................ 330/253, 252, 330/259, 263

(56) References Cited

U.S. PATENT DOCUMENTS

| | | | | |
|---|---|---|---|---|
| 3,370,242 A | * | 2/1968 | Offner | 330/9 |
| 4,578,647 A | * | 3/1986 | Sasamura | 330/253 |
| 6,118,340 A | * | 9/2000 | Koen | 330/253 |
| 6,281,749 B1 | * | 8/2001 | Klayman et al. | 330/252 |
| 6,292,056 B1 | * | 9/2001 | Hallen | 330/258 |

* cited by examiner

Primary Examiner—Henry Choe
(74) Attorney, Agent, or Firm—Incaplaw; Terrance A. Meador

(57) ABSTRACT

An impedance element connecting the outputs of two transistors of a wide-bandwidth amplifier forms a zero. The output of transistor is connected to a current source. The wide-bandwidth amplifier has a bandwidth greater than conventional amplifiers utilizing a single current source without an increase in power dissipation.

17 Claims, 5 Drawing Sheets

US 6,664,853 B1

WIDE-BANDWIDTH DIFFERENTIAL SIGNAL AMPLIFIER

BACKGROUND OF THE INVENTION

The invention relates in general to electronic circuits and more specifically to differential signal amplifiers.

Differential signal amplifiers amplify a differential signal to form an amplified differential output signal and can be used for a variety of purposes and within different types of circuits. The differential signal amplifier produces a differential output signal from a differential input signal that includes two signals where each of the two signals is complementary to the other. Typical uses of differential signal amplifiers include using an amplifier with a gain greater than 1 to increase the amplitude of the input signal. Several differential signal amplifiers may be connected to form an amplifier with a higher gain. Other uses include using the amplifier as a buffer between circuits. Applications for differential signal amplifiers include uses within current mode logic (CML) circuits. Another example includes high frequency postamplifiers for use in high speed circuits such as SONET transceivers. Complementary Metal Oxide Semiconductor (CMOS) techniques are often used to manufacture the amplifiers.

In order to achieve high frequency performance in CMOS differential signal amplifiers, conventional techniques result in increased power dissipation within the amplifiers. Conventional amplifiers designs include biasing the transistors of the amplifier such that the DC current is increased. Conventional designs, therefore, result in circuits having increased power dissipation. Further, conventional circuits may not meet bandwidth requirements even if the DC current is increased to a maximum.

Therefore, there is a need for an efficient differential signal amplifier with increased high frequency performance.

SUMMARY OF THE INVENTION

In an exemplary embodiment, a wide-bandwidth amplifier includes a pair of transistors having output ports connected to two current sources and an impedance element connected between the output ports. The impedance element creates a zero resulting a wide-bandwidth frequency response of the amplifier.

DETAILED DESCRIPTION OF THE PREFERRED EMBODIMENTS

Figure 1:
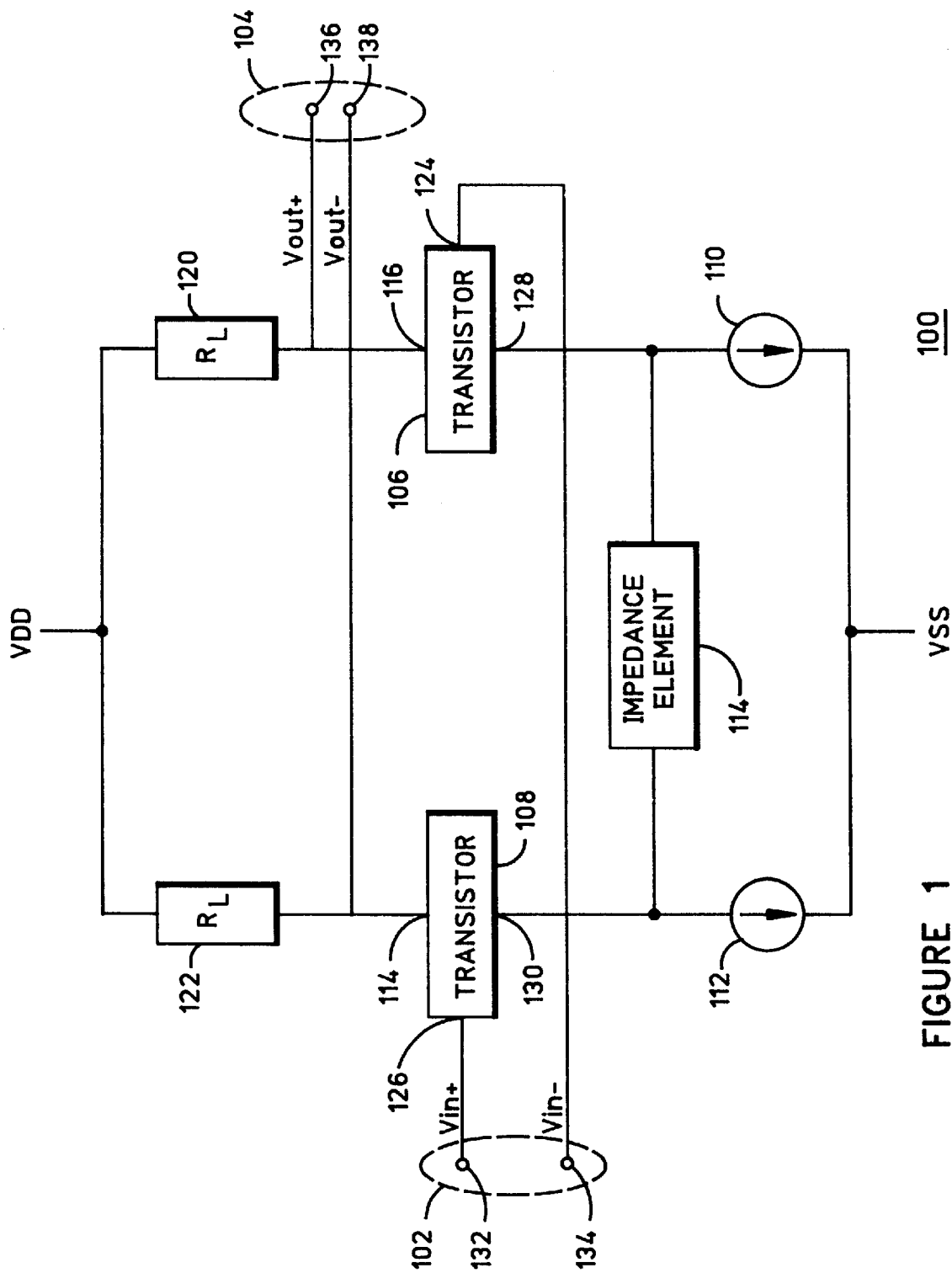
FIG. 1 is a block diagram of a wide-bandwidth amplifier in accordance with an exemplary embodiment of the invention.

FIG. 1 is a block diagram of a wide-bandwidth amplifier 100 in accordance with exemplary embodiment of the invention. The wide-bandwidth amplifier 100 may be implemented using discrete components, in an integrated circuit (IC) or in any combination of integrated circuits and discrete components formed in accordance with any single manufacturing technique or combination of techniques. In the exemplary embodiment, the wide-bandwidth amplifier 100 is implemented with field effect transistors (FETs) within an integrated circuit in accordance with the teachings herein and known techniques. The wide-bandwidth amplifier 100 can be used for a variety of circuits. Several amplifiers 100 may be connected to form an amplifier with a higher overall gain. An example of a suitable use for the amplifier 100 includes implementing the amplifier 100 in accordance with CMOS techniques for use within a postamplifier within a SONET transceiver for high speed transmission of signals.

The wide-bandwidth amplifier 100 amplifies a differential input signal received across an amplifier input 102 to produce a differential output signal at an amplifier output 104. Although in the exemplary embodiment, the amplifier 100 has a gain that is greater than 1, the amplifier 100 can be used as an output buffer or for other purposes where the amplitude of the output signal does not need to be greater than the input signal and the gain of the amplifier is less than 1.

In the exemplary embodiment, the amplifier 100 includes at least two transistors 106, 108, two current sources 110, 112 and an impedance element 114. The inputs 116, 118 of the transistors are connected to a supply voltage (VDD) through load resistors 120, 122. Each current source 110, 112 is connected between an output port 128, 130 of a transistor 106, 108 and a voltage reference (VSS) such as ground. The impedance element 114 is connected between the two output ports 128, 130 of the transistors 106, 108.

Although in the exemplary embodiment the transistors 106, 108 are Complementary Metal Oxide Semiconductor (CMOS) field effect transistors (FETs), the invention is not limited to any particular type of transistor or semiconductor technology. The input ports (116, 118), control ports (124, 126) and the output ports 128, 130 respectively correspond to the drain, gate and source of a field effect transistor (FET) and to the collector, base and emitter of a bipolar junction transistor (BJT).

During operation of the wide-bandwidth amplifier, current flows through the transistors in accordance with the voltage levels at the amplifier input 102. As a result, current flows through the load resistors 120, 122 and the output signal is produced at the amplifier output 104. As the voltage is increased at the Vin+ port 132, the signal received at the Vin− port 134 decreases and additional current flows through the transistor 108 resulting in a voltage drop across the connected load resistor 122. The voltage at the Vout− port 138, therefore, decreases. The voltage at the Vout+ port 136 increases since less current flows through the transistor 106 and a smaller voltage drop results across the resistor 120.

As discussed with reference to FIG. 3 below, the impedance element can be a resistor connected in parallel to a capacitor. The impedance element 114 creates a zero in the frequency response resulting in a higher bandwidth frequency response as compared to a conventional amplifier using a single current source connected to both output ports 128, 130 of the transistors 106, 108.

Figure 2:
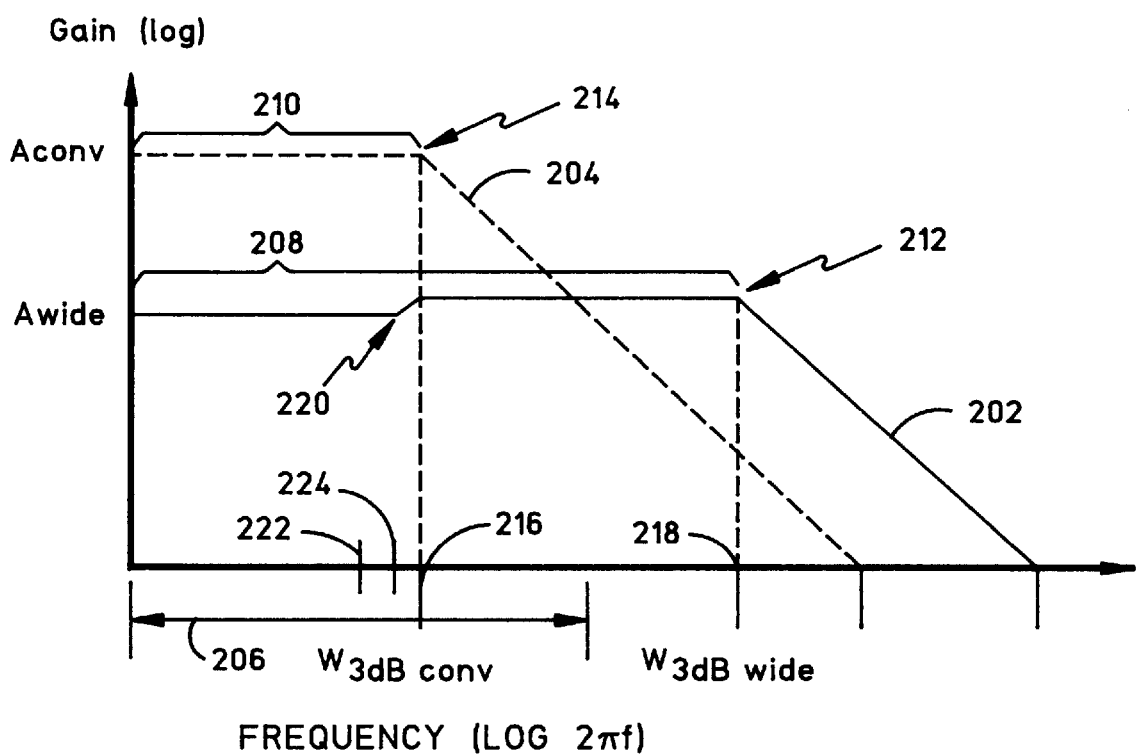
FIG. 2 is graphical representation of a frequency response of the wide-band amplifier in accordance with the exemplary embodiment of the invention.

FIG. 2 is graphical representation of a frequency response 202 of the wide-bandwidth amplifier 100 compared to a frequency response 204 of a conventional amplifier where both output ports 124, 126 of the transistors 106, 108 are connected to a single current source (110, 112). At low frequencies 206, the gain, $A_{wide}$, of the wide-bandwidth amplifier 100 is less than the gain, $A_{conv}$, of a conventional amplifier without an impedance element 114. The bandwidth 208, however, of the wide-bandwidth amplifier 100 is greater than the bandwidth 210 of the conventional amplifier. Although various methods can be used to draw comparisons to the bandwidth performance of the amplifiers, the bandwidths 208, 210 are defined as 3 dB bandwidths. Therefore, the 3 dB points $\omega_{3dBwide}$212 and $\omega_{3dBconv}$ 214 indicate the frequencies 216, 218 where the gain is 3 dB below the low frequency gain ($A_{conv}$, $A_{wide}$). The impedance element 114 provides a zero resulting in a higher bandwidth frequency response 202. In addition to the zero, a pole is formed in the frequency response. The frequency location 224 of the pole depends on the impedance element, the impedance of the load at the output 104 and the characteristics of the transistors 106, 108. In certain situations, the zero-pole combination results in a disturbance 220 in the frequency response 202 of the wide-bandwidth amplifier 100. In the exemplary embodiment, the impedance element 114 is selected to minimize the disturbance 220 and, therefore, to maintain the frequency response 202 as flat as possible. The frequency locations 224, 222 of the pole and zero can be arranged by adjusting several parameters and, in many situations, are selected to closely space the zero and pole frequency locations 222, 224 and maintain a relatively flat frequency response.

Figure 3:
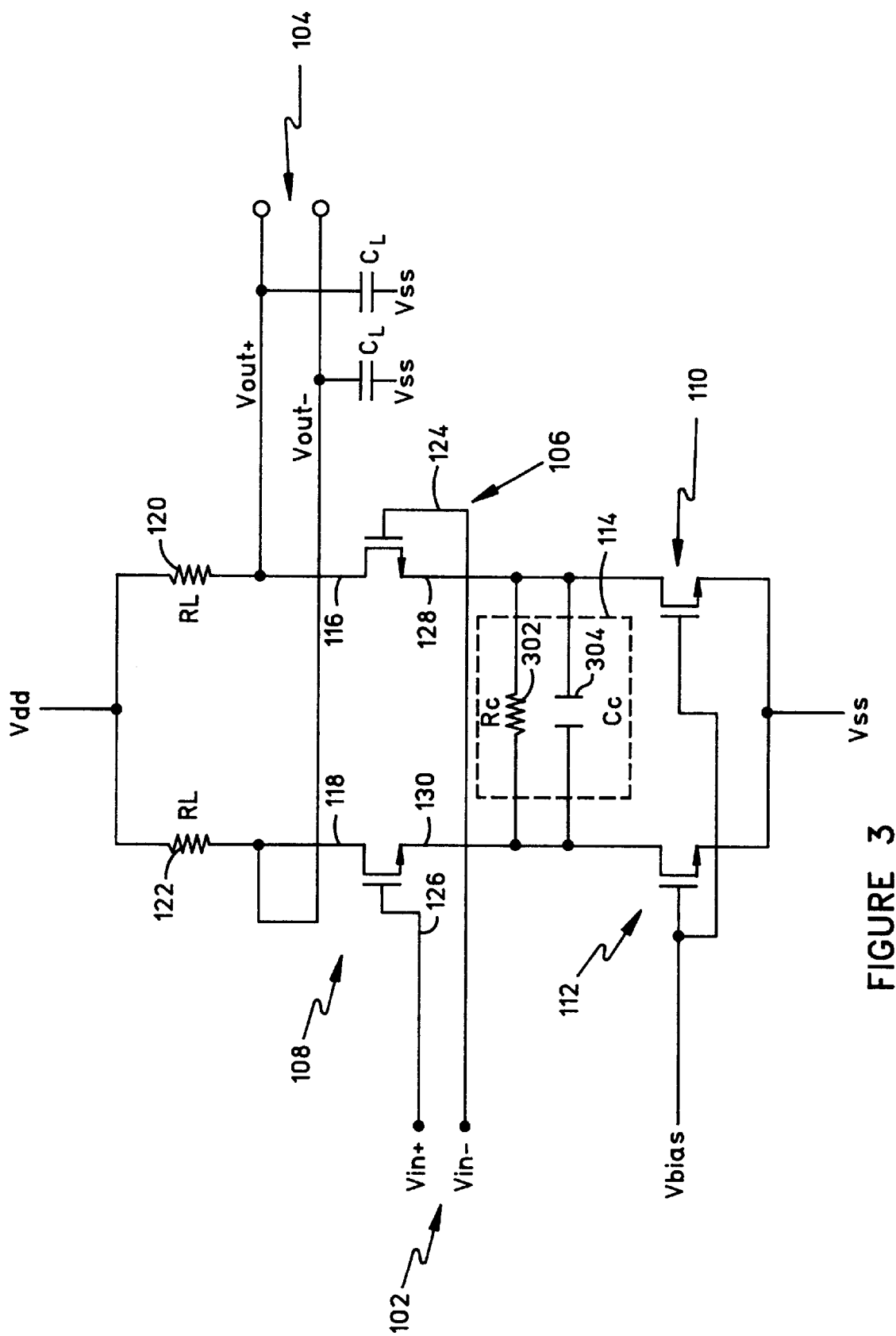
FIG. 3 is a schematic diagram of the wide-band amplifier in accordance with the exemplary embodiment where the transistors are implemented using Complementary Metal Oxide Semiconductor (CMOS) field effect transistors (FETs).

FIG. 3 is a schematic diagram of the wide-band amplifier 100 in accordance with the exemplary embodiment where the transistors 106, 108 are Complementary Metal Oxide Semiconductor (CMOS) field effect transistors (FETs). The current sources are CMOS transistors that are biased at a bias voltage (Vbias). In the exemplary embodiment, the impedance element 114 is a resistor 302, having a value of Rc, connected in parallel to a capacitor 304 having a value of Cc. The resistor 302 and capacitor 304 create a zero resulting in a frequency response 202 having a wider bandwidth than conventional amplifiers without an increase in power dissipation. At low frequencies, the capacitor 304 has a high impedance allowing the resistor 302 to be the dominant impedance between the two output two sources 128, 130 of the transistors 106, 108. At higher frequencies, the capacitor 304 begins to appear as a short between the sources 128, 130 reducing the overall impedance of the impedance element 114. In the exemplary embodiment, the values (Rc, Cc) of the resistor 302 and capacitor 304 are selected such that the frequency response is maintained as close as possible to a constant gain within the desired band of operation. In general, Cc is chosen such that the impedance element 114 begins to appear as short at the same frequency that the capacitance (CL) of loads at the amplifier output 104 begins to short out the resistors 120, 122.

The appropriate values of the resistor 302 and the capacitor 304 for a particular wide-bandwidth amplifier 100 can be selected by using the equations below in accordance with known techniques and the teachings herein. The characteristics of the wide-bandwidth amplifier can be approximated by the following equations, where $g_m$ is the transconductance of the transistors, $r_o$ is the internal output resistance, $S_{zero}$ is the frequency in radians of the zero, $S_{dompole}$ is the frequency of the dominant pole, $S_{comppole}$ is the frequency of the pole corresponding to the impedance element 114 in combination with the output load and the characteristics of the transistors 106, 108.

$$A_{DC} = \frac{-g_m r_o}{\frac{r_o}{R_L // r_o} + (1 + g_m r_o)\frac{R_C}{R_L}} \quad (1)$$

$$S_{zero} = \frac{1}{R_C C_C} \quad (2)$$

$$S_{dompole} \approx \frac{1}{R_C C_C} + \frac{1}{C_L(R_L // r_o)} + \frac{1 + g_m r_o}{r_o C_C} \quad (3)$$

$$S_{comppole} \approx \frac{\frac{1}{R_C} + g_m}{\frac{C_L R_L}{R_C} + C_C + g_m C_L R_L} \quad (4)$$

Figure 4:
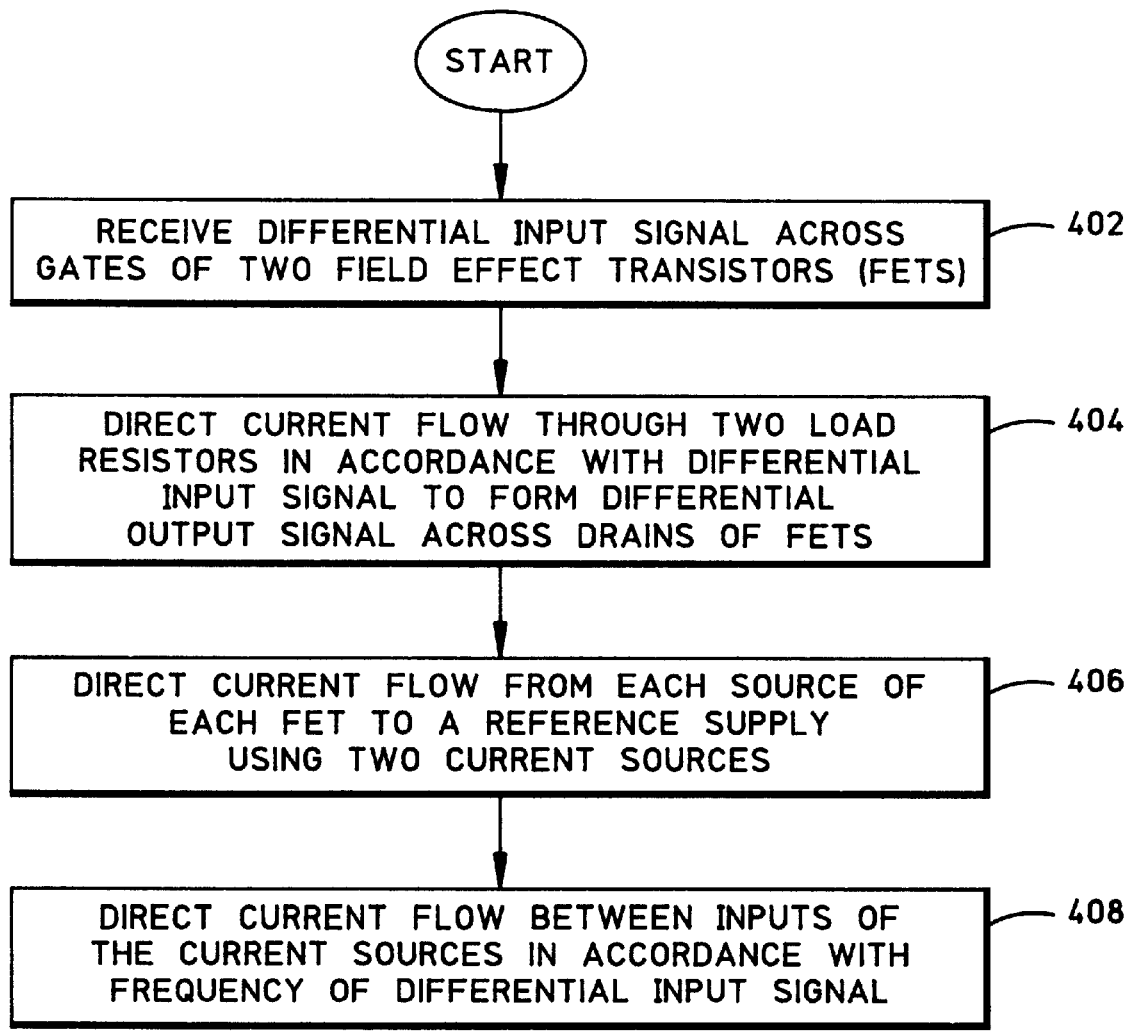
FIG. 4 is a flow chart of method of forming the differential output signal in accordance with the exemplary embodiment of the invention.

FIG. 4 is flow chart of method of producing a differential output signal form a differential input signal in accordance with the exemplary embodiment of the invention. Although the method is performed in the wide-bandwidth amplifier 100 in the exemplary embodiment, the method can be applied to other hardware configurations or in other situations.

At step 402, the differential input signal is received across the gates 124, 126 of the two field effect transistors (FETs) 106, 108.

At step 404, the current is directed through the two load resistors 120, 122 in accordance with the input signal to form the output signal across the drains 116, 118 of the FETs 106. 108. Changes in the input signal vary the current flow through the FETs 106, 108 and the load resistors 120, 122.

At step 406, current is directed from each source of each FET 106, 108 to the reference supply (VSS) using two current sources 110, 112.

At step 408, current is directed between the inputs of the current sources 110, 112 in accordance with a frequency of the input signal. At low frequencies, the capacitor 304 is a high impedance allowing the resistor 302 to be the dominant impedance between the two current sources 110, 112. The current flow at low frequencies, is primarily through the resistor 302. As the frequency of the input signal is increased, however, the capacitor 304 becomes more prominent in the connection between the sources 110, 112. As frequency of the input signal is further increased, the capacitor 304 begins to appear as short circuit, where most of the current flows between the two sources 110, 112 through the capacitor 304.

Figure 5:
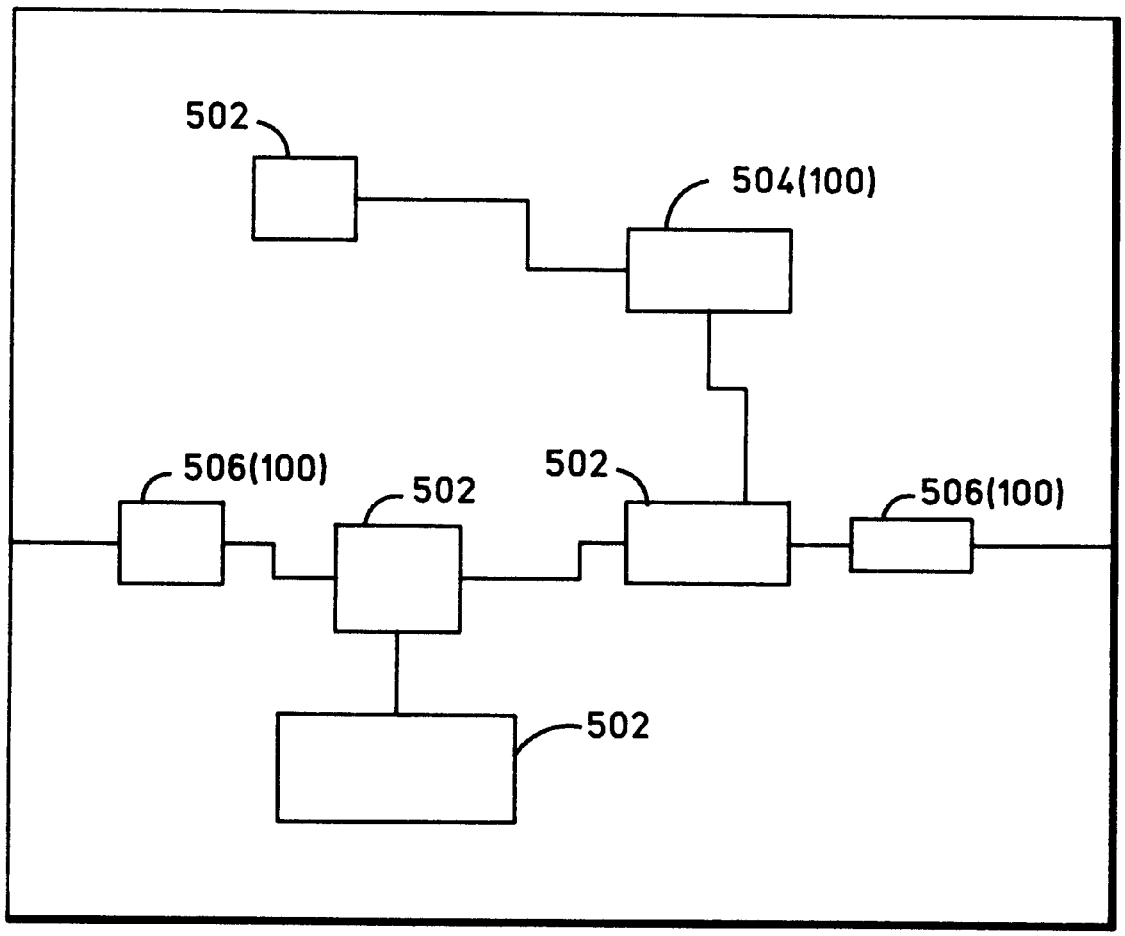
FIG. 5 is a block diagram of a top view representation of an Integrated Circuit (IC) in accordance with the exemplary embodiment of the invention.

FIG. 5 is a block diagram of a top view representation of an integrated circuit (IC) 500 including at least one wide-bandwidth amplifier 100 implemented as an IC amplifier 504, 506 in accordance with the exemplary embodiment of the invention. The exemplary IC 500 includes a several circuits 402 and IC amplifier 504, 506 (100) formed with transistors, resistors, capacitors and other components using appropriate etching and imprinting techniques on a semiconductor material such a silicon, germanium, or Gallium Arsenide (GaAs). The IC buffer circuits 504 may be connected between other circuits 502 on the IC 500 to provide amplification or buffering between the circuits 502 on the IC 500. The IC amplifier 506 may provide an interface to external circuits not on the IC 500. Further, the IC 500 can be manufactured to include only an IC amplifier 506 or an array of IC amplifiers 506.

Therefore, the impedance element 114 forms a zero and increases the bandwidth of the frequency response 202 of the wide-bandwidth amplifier 100 as compared to a conventional amplifier. Each source 128, 130 of a pair of FETs 106, 108 is connected to a current source 110, 112 where the impedance element 114 is connected between the two sources 110, 112.

Clearly, other embodiments and modifications of this invention will occur readily to those of ordinary skill in the art in view of these teachings. Therefore, this invention is to be limited only by following claims, which include all such embodiments and modifications when viewed in conjunction with the above specification and accompanying drawings.

We claim:

1. An amplifier for producing an output signal at an amplifier output in response to an input signal received at an amplifier input, the amplifier comprising:
   a pair of transistors, each transistor of the pair having a control port, an input port and an output port, the control ports forming the amplifier input and the input ports forming the amplifier output;
   a pair of current sources, each current source of the pair of current sources connected to the output port of one of the transistors;
   a capacitor having its ends respectively directly connected to the output ports; and
   a resistor having its ends respectively directly connected to the output ports.

2. An amplifier in accordance with claim 1, wherein the combination of the capacitor and the resistor creates a zero.

3. An amplifier in accordance with claim 1, wherein each of the pair of transistors is a field effect transistor (FET), the input port corresponding to a drain of the FET, the output port corresponding to a source of the FET, and the control port corresponding to a gate of the (FET).

4. An amplifier in accordance with claim 3, wherein each of the FETs is a CMOS FET.

5. An amplifier in accordance with claim 3, wherein each of the current sources is a FET.

6. An amplifier in accordance with claim 5, wherein each of the current sources is a CMOS FET.

7. An amplifier for producing a differential output signal at an amplifier output in response to a differential input signal received at an amplifier input, the amplifier comprising:
   a first Complementary Metal Oxide Semiconductor Field Effect Transistor (CMOSFET) having a drain connected to a supply voltage through a first load resistor;
   a second Complementary Metal Oxide Semiconductor Field Effect Transistor (CMOSFET) having a drain connected to the supply voltage through a second load resistor; the amplifier input formed across a gate of the first CMOSFET and a gate of the second CMOSFET, the amplifier output formed across the drains of the first and second CMOSFETs;
   a first current source FET connected to a source of the first CMOSFET;
   a second current source FET connected to a source of the second CMOSFET;
   a compensation resistor having a first end directly connected to the source of the first CMOSFET and a second end directly connected to the source of the second CMOSFET; and
   a compensation capacitor having a first end directly connected to the source of the first CMOSFET and a second end directly connected to the source of the second CMOSFET.

8. An amplifier in accordance with claim 7, wherein the compensation capacitor and the compensation resistor form a zero in a frequency response of the amplifier.

9. A method for amplifying a differential input signal to form a differential output signal, the method comprising:
   receiving the differential input signal across gates of two field effect transistors (FETs), a drain of each FET connected to a supply voltage through a load resistor;
   directing current flow through the two load resistors in accordance with the input signal to form the output signal across the drains of the FETs;
   directing current flow from each source of each FET to a reference supply using two current sources each having an input connected to one of the FET sources; and
   directing current flow through a parallel combination of a compensation capacitor and a compensation resistor, the parallel combination having a first end directly connected to the input of one of the two current sources and a second end directly connected to the input of the other one of the two current sources, and between the inputs of the current sources in accordance with a frequency of the input signal.

10. A method in accordance with claim 9, wherein the directing of current flow between the inputs of the sources further comprises:
    directing more current flow through the compensation resistor than through the compensation capacitor when the frequency is zero; and
    directing more current flow through the compensation capacitor than through the compensation resistor when the frequency is at a 3 dB bandwidth frequency of a frequency response defined by the relationship between the output signal and the input signal over frequency.

11. An integrated circuit comprising:
    an amplifier for producing an output signal at an amplifier output in accordance with an input signal received at an amplifier input, the amplifier comprising:
    a pair of transistors, each transistor of the pair having a control port, an input port and an output port, the control ports forming the amplifier input and the input ports forming the amplifier output;
    a pair of current sources, each current source of the pair of current sources connected to the output port of one of the transistors;
    a capacitor having its ends respectively directly connected to the output ports; and
    a resistor having its ends respectively directly connected to the output ports.

12. An integrated circuit in accordance with claim 11, wherein the combination of the capacitor and the resistor creates a zero.

13. An integrated circuit in accordance with claim 11, wherein each of the pair of transistors is a field effect transistor (FET), the input port corresponding to a drain of the FET, the output port corresponding to a source of the FET, and the control port corresponding to a gate of the (FET).

14. An integrated circuit in accordance with claim 13, wherein each of the FETs is a CMOS FET.

15. An integrated circuit in accordance with claim 14, wherein each of the current sources is a FET.

16. An integrated circuit in accordance with claim 15, wherein each of the current sources is a CMOS FET.

17. An integrated circuit comprising:
    an amplifier for producing a differential output signal at an amplifier output in response to a differential input signal received at an amplifier input, the amplifier comprising:

a first Complementary Metal Oxide Semiconductor Field Effect Transistor (CMOSFET) having a drain connected to a supply voltage through a first load resistor;

a second Complementary Metal Oxide Semiconductor Field Effect Transistor (CMOSFET) having a drain connected to the supply voltage through a second load resistor; the amplifier input formed across a gate of the first CMOSFET and a gate of the second CMOSFET, the amplifier output formed across the drains of the first and second CMOSFETs;

a first current source FET connected to a source of the first CMOSFET;

a second current source FET connected to a source of the second CMOSFET;

a compensation resistor having a first end directly connected to the source of the first CMOSFET and a second end directly connected to the source of the second CMOSFET; and a compensation capacitor having a first end directly connected to the source of the first CMOSFET and a second end directly connected to the source of the second CMOSFET.

* * * * *